United States Patent
Spalink et al.

(10) Patent No.: US 8,922,719 B2
(45) Date of Patent: Dec. 30, 2014

(54) CIRCUIT AND METHOD FOR PROCESSING AN INPUT SIGNAL

(75) Inventors: Gerd Spalink, Stuttgart (DE); Ben Eitel, Gärtringen (DE)

(73) Assignee: Sony Deutschland GmbH, Berlin (DE)

( * ) Notice: Subject to any disclaimer, the term of this patent is extended or adjusted under 35 U.S.C. 154(b) by 1918 days.

(21) Appl. No.: 12/039,250

(22) Filed: Feb. 28, 2008

(65) Prior Publication Data

US 2008/0252368 A1    Oct. 16, 2008

(30) Foreign Application Priority Data

Mar. 31, 2007   (EP) .................................... 07006798

(51) Int. Cl.
*H04N 5/00*    (2011.01)
*H04N 5/455*   (2006.01)
*H03D 3/00*    (2006.01)
*H03D 3/02*    (2006.01)
*H03D 3/24*    (2006.01)

(52) U.S. Cl.
CPC ..................... *H03D 3/241* (2013.01)
USPC ............ 348/614; 348/726; 329/315; 329/325

(58) Field of Classification Search
USPC .......................... 348/614, 726; 329/315, 325
See application file for complete search history.

(56) References Cited

U.S. PATENT DOCUMENTS

| | | | |
|---|---|---|---|
| 3,909,735 A | 9/1975 | Anderson et al. | |
| 4,479,091 A | 10/1984 | Yoshisato | |
| 4,764,730 A * | 8/1988 | Miyo et al. | 329/307 |
| 5,533,059 A | 7/1996 | Tsuda | |
| 6,246,444 B1 * | 6/2001 | Kim | 348/614 |
| 6,304,619 B1 * | 10/2001 | Citta et al. | 375/343 |
| 2003/0143950 A1 | 7/2003 | Maldonado | |
| 2004/0119514 A1 * | 6/2004 | Karlquist | 327/158 |
| 2006/0064725 A1 * | 3/2006 | Rabinowitz et al. | 725/68 |
| 2006/0115019 A1 * | 6/2006 | Jensen | 375/327 |
| 2008/0150588 A1 * | 6/2008 | Lin | 327/12 |

OTHER PUBLICATIONS

U.S. Appl. No. 12/032,129, filed Feb. 15, 2008, Spalink.
Office Action issued Oct. 17, 2011, in Chinese Patent Application No. 200810088473.6 (English translation only).
Office Action issued Jun. 1, 2012 in Chinese Patent Application No. 200810088473.6, with English translation.

* cited by examiner

*Primary Examiner* — Nasser Goodarzi
*Assistant Examiner* — Kyu Chae
(74) *Attorney, Agent, or Firm* — Oblon, Spivak, McClelland, Maier & Neustadt, L.L.P.

(57) ABSTRACT

Circuit for processing an input signal based on at least one reference signal, comprising a phase locked loop demodulator configured to receive a speed control signal and said input signal and further configured to follow a frequency and/or a phase of said input signal at a speed, wherein said speed depends on said speed control signal; and a reference signal detector configured to determine said at least one reference signal and to set said speed by outputting said speed control signal to said phase locked loop demodulator, wherein, if said reference signal detector detects said at least one reference signal, said reference signal detector decreases said speed.

32 Claims, 8 Drawing Sheets

CIRCUIT AND METHOD FOR PROCESSING AN INPUT SIGNAL

An embodiment of the invention relates to a circuit and method for processing an input signal. A further embodiment of the invention relates to a receiver and a still further embodiment to a television set.

BACKGROUND

There exist a large number of signal processing devices, where a phase locked loop is applied among other signal processing parts. For example, there exist OFDM-signals, analogue television signals or other signals that need to be demodulated, wherein a phase locked loop is used. The resulting signal of the phase locked loop is then used for further processing.

It is an object of the invention to provide a circuit for processing an input signal, wherein the processed signal is improved.

This object is solved by a circuit, method and receiver according to claims 1, 17, and 18, respectively.

Further details of the invention will become apparent from a consideration of the drawings and ensuing description.

DETAILED DESCRIPTION

In the following, embodiments of the invention are described. It is important to note that all described embodiments in the following may be combined in any way, i.e. there is no limitation that certain described embodiments may not be combined with others.

Figure 1:
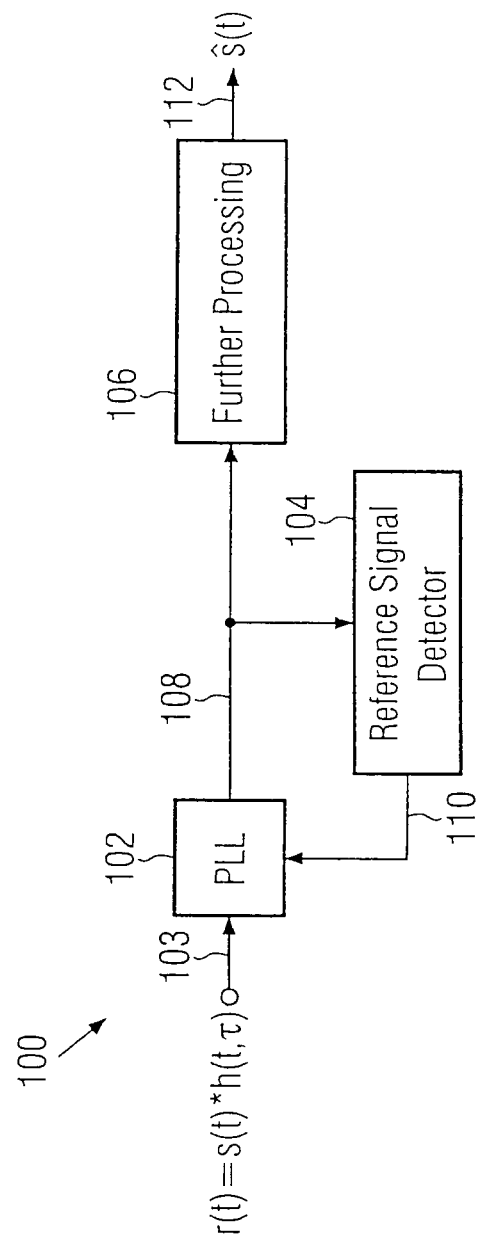
FIG. 1 shows a block diagram according to an embodiment of the invention.

FIG. 1 shows a circuit 100 comprising a phase locked loop (PLL) circuit 102, reference signal detector 104 and further processing block 106. PLL circuit receives an input signal 103. The input signal 103 may be of various types and/or sources. For example, input signal 103 could be an OFDM signal, or any kind of analog signal, e.g. a television or radio signal. Input signal 103 may correspond to a received signal $r(t)=s(t)*h(t,\tau)$. $s(t)$ may denote a signal that has been sent out from a sending device, e.g. broadcast station or the like. $h(t,\tau)$ may describe the characteristics of the channel over which signal $s(t)$ has been transmitted.

PLL circuit 102 tries to detect frequency and/or phase of input signal 103 and outputs a demodulated signal 108. Demodulated signal 108 is fed to reference signal detector 104 that is configured to detect a reference signal within demodulated signal 108. If reference signal detector 104 detects a reference signal, reference signal detector 104 outputs a speed control signal 110 to PLL circuit 102. The speed control signal 110 sets a speed of PLL circuit 102. "Speed" in the context of this specification may e.g. describe the following speed or correction speed or the PLL, i.e. the speed with which the phase locked loop demodulator follows the frequency and/or phase of the input signal 103.

The speed control signal 110 may also be set such that PLL circuit 102 is completely stopped, i.e. PLL circuit 102 does not follow the frequency and/or phase of input signal 103.

Thus, the circuit 100 shown in FIG. 1 allows for controlling the speed of the PLL circuit 102 during or based on a reference signal detected by reference signal detector 104 and speed control signal 110.

Further processing block 106 may accommodate further processing parts such as e.g. various filters e.g. adaptive filters for filtering various distortions of input signal 103 and/or demodulated signal 108. Further processing block 106 may also process the reference signal, and, in certain applications it may be desirable that the distorted signal 103 is not or to a lesser extent modified by PLL circuit 102. Thus, according to the embodiment of FIG. 1, it is possible to eliminate processing of input signal 103 by PLL circuit 102 or at least to weaken the influence of the PLL depending on reference signals. Since the reference signals are also received in further processing block 106, processing in further processing block 106 may not be influenced by a certain behavior of the PLL circuit 102.

The output signal 112 in FIG. 1 corresponds to a signal $\hat{s}(t)$, i.e. an estimation of signal $s(t)$.

It should be noted that there is no limitation that the reference signal is detected within demodulated signal 108. It may also be possible to detect the reference signal within input signal 103. It may also be possible that a reference signal be transmitted independently of input signal 103, i.e. via a different channel or the like. In this case, reference signal detector 104 may not need as input demodulated signal 108 and/or input signal 103.

According to the embodiment of FIG. 1, it may be possible that the reference signal detector decreases the speed to a predetermined level, wherein the predetermined level is lower than a normal level before a reference signal has been detected. The speed may be decreased for a predetermined period of time or for a period of time which depends on the duration of a reference signal. Further, the period of time may start before an (expected) occurrence of the reference signal and may last until after the occurrence of the reference signal. For example, if the reference signal is an analogue television signal, then it is a priori known in which lines a reference signal occurs, e.g. in line 18 and 281. In this case, the speed of the PLL may already be lowered half a line before line 18 and maintained at the low level until half a line after the 18$^{th}$ line.

Figure 2:
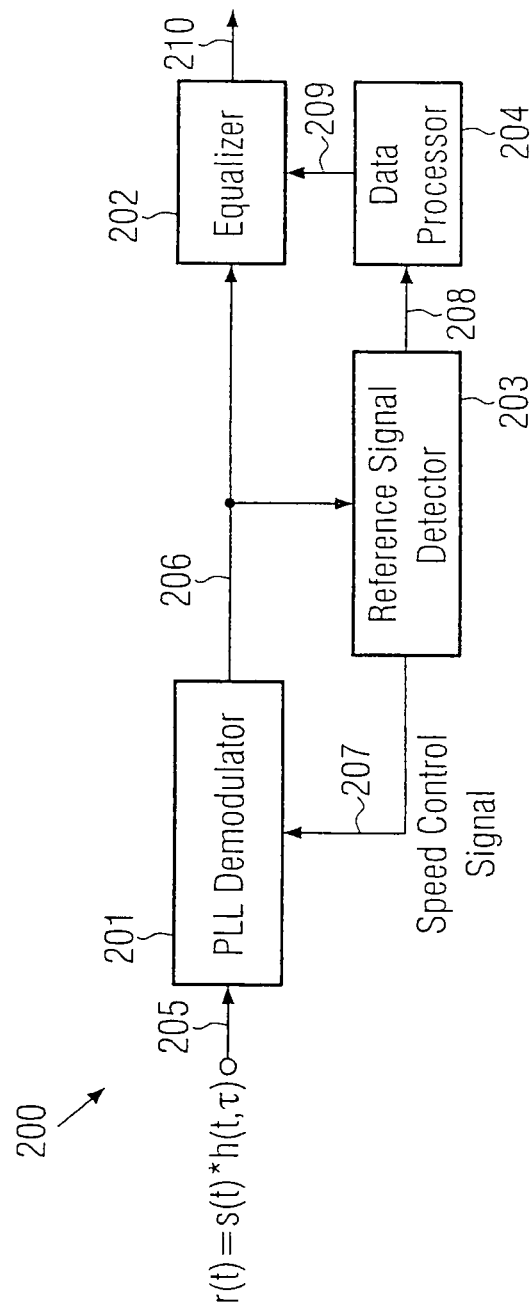
FIG. 2 shows a further block diagram according to a further embodiment of the invention.

FIG. 2 shows a further example of a circuit 200 comprising a PLL demodulator 201, equalizer 202, reference signal detector 203 and data processor 204.

PLL demodulator 201 receives an input signal 205 corresponding to a received signal $r(t)=s(t)*h(t,\tau)$. PLL demodulator 201 outputs a demodulated signal 206 that may comprise a reference signal. The reference signal is detected by a reference signal detector 203 that outputs a speed control signal 207. Speed control signal 207 controls the speed of PLL demodulator 201, i.e. reference signal detector 203 may set the speed of PLL demodulator 201 according to which speed PLL demodulator 201 follows the frequency and/or phase of input signal 205.

The input signal 205 may be distorted, i.e. input signal 205 may comprise complex echoes or the like. Thus, the input signal 205 may comprise a main path signal part and an echo signal part. The main path signal corresponds to a received signal part that has not or only very little been reflected on the way from a sender to the receiver. PLL demodulator 201 may try to follow the input signal including such echoes. However, the PLL should in fact only follow the main path signal part and not the echo signal part. Therefore, the PLL may cause distortions that may be avoided as explained.

In certain embodiments, although, PLL demodulator 201 does not follow the frequency and/or phase of input signal 205 at a high speed, it may cause less problems in data processor 204. For example, it may be desirable that data processor 204 receives a signal without distortions caused by PLL demodulator 201. This may allow determining filter coefficients 209 that are better suited for equalizing signal 205/206.

Therefore, equalizer 202 may be based on filter coefficients 209 that are determined by data processor 204 e.g. based on a signal 208 generated by a reference signal detector 203. Signal 208 may comprise demodulated signal 206 and/or a detected reference signal.

The output of equalizer 202 is an equalized signal 210.

The phase locked loop demodulator in FIG. 2 may comprise a speed control mechanism configured to control the speed. The speed control mechanism may be a multiplier arranged in a feedback path of the phase locked loop demodulator. The speed control signal may also indicate a zero speed if a reference signal is detected.

Figure 3:
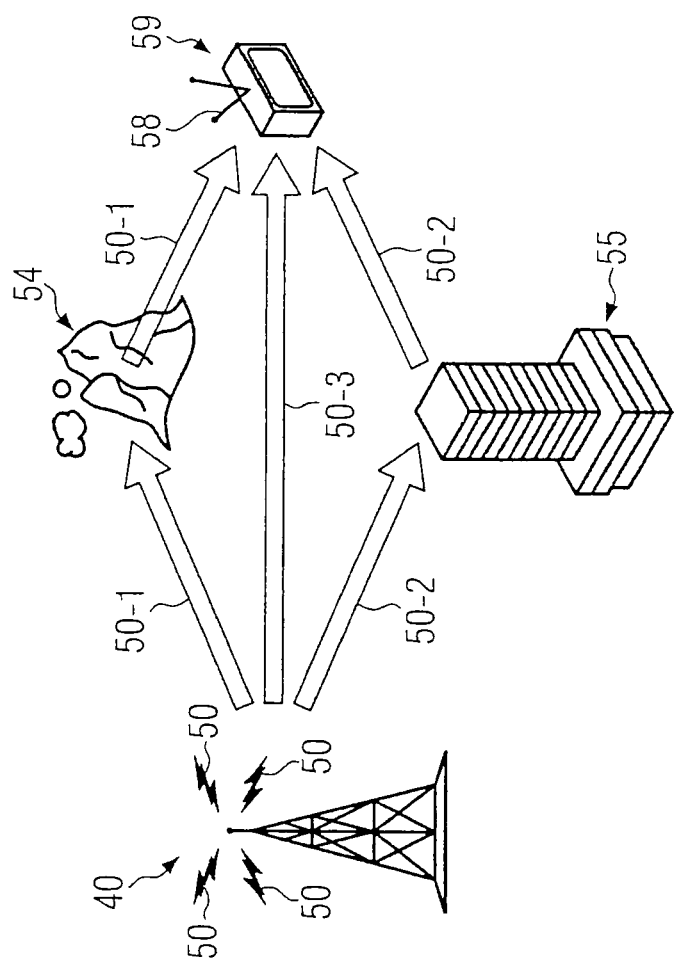
FIG. 3 shows an analogue television signal comprising echoes.

FIG. 3 shows a broadcast station 40 which may be e.g. a television broadcast station, broadcasting a television signal 50.

Television signal 50 may be received by an antenna 58 of a television set 59 of a user. However, antenna 58 may receive several parts of television signal 50, i.e. a first echo signal 50-1 of said television signal 50, a second echo signal 50-2 of said television signal 50 and a main path signal 50-3 of said television signal 50. The first echo signal 50-1 may have been caused by a first obstacle 54, e.g. a mountain. The second echo signal 50-2 may have been caused by a second obstacle 55, e.g. a building. The main path signal 50-3 is received by antenna 58 without having been reflected by any obstacle.

When demodulating the received signal 50-1, 50-2 and 50-3 in television set 59, the demodulated video picture may have picture distortions.

It is important to note that although FIG. 1 and the further description shows a television signal, all of the described embodiments of the invention may also be applied in other fields of radio communication, e.g. in satellite communication, when broadcasting/receiving a radio signal and various other fields where signals need to be demodulated that may comprise echoes. For example, the explained principles may also be applied to an orthogonal frequency division multiplex (OFDM) signal. Also, it is not necessary that input signal have been transmitted wireless. All explained principles are likewise applicable if the signals were transmitted e.g. via cable.

Figure 4:
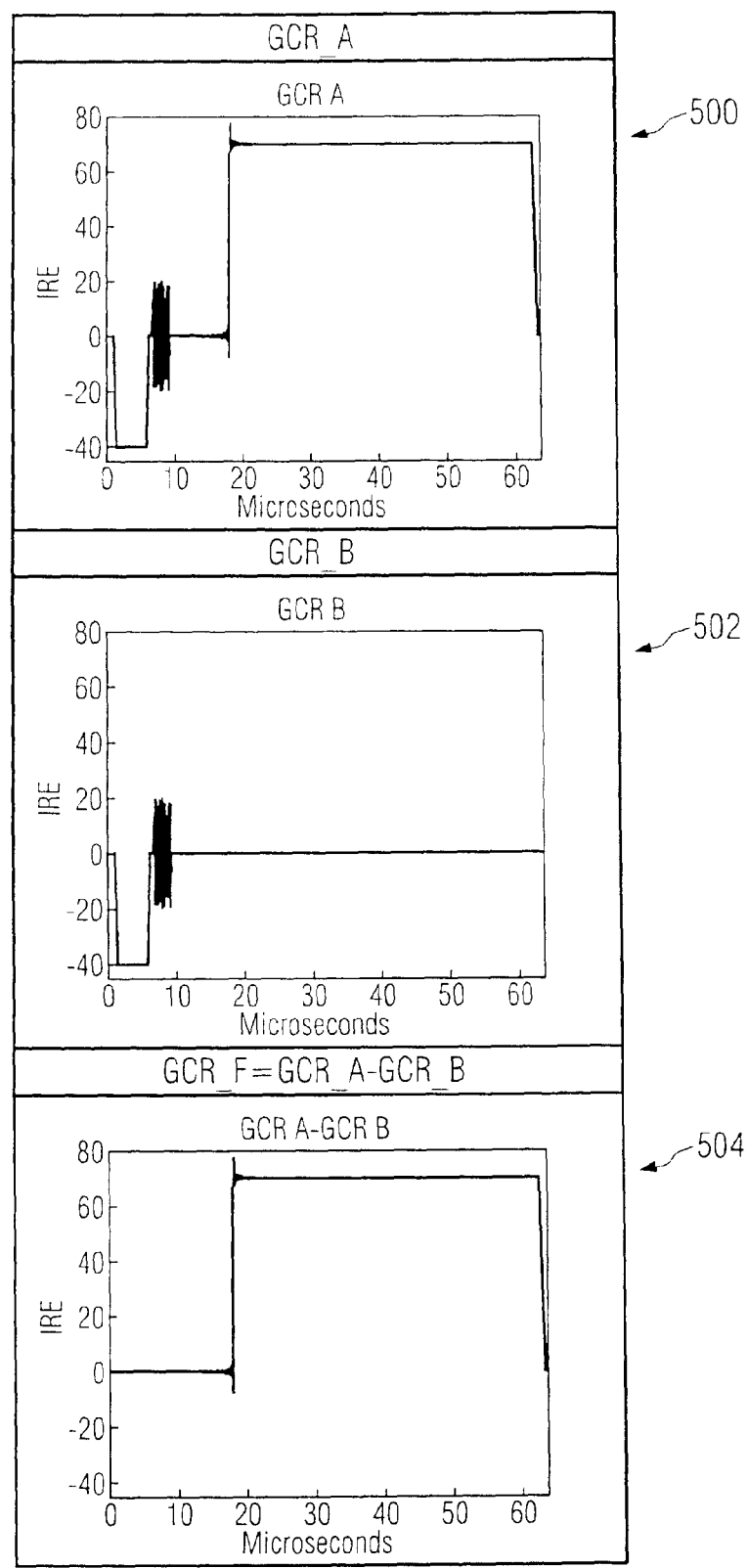
FIG. 4 shows a diagram with ghost canceling reference signals.

FIG. 4 shows a first ghost canceling reference signal 500 GCR_A, a second ghost canceling reference signal 502 GCR_B and a ghost canceling reference difference signal 504 GCR_F=GCR_A−GCR_B.

Such ghost canceling reference signals may e.g. be included in an analogue television signal in order to cancel ghosts. Therefore, the exact form of either one of the ghost canceling reference signals or the ghost canceling reference difference signal is known at the receiver side. For example, ghost canceling reference difference signal GCR_F may be known at the receiver, wherein the broadcaster sends out first reference signal 500 and second reference signal 502. The receiver then may receive a distorted first and second ghost canceling reference signal and determines a (distorted) ghost canceling reference difference signal GCR_F'.

Then, the receiver may compare the predetermined (known) ghost canceling reference difference signal GCR_F with the calculated ghost canceling reference signal GCR_F' corresponding to the difference of the received ghost canceling reference signal.

Figure 5:
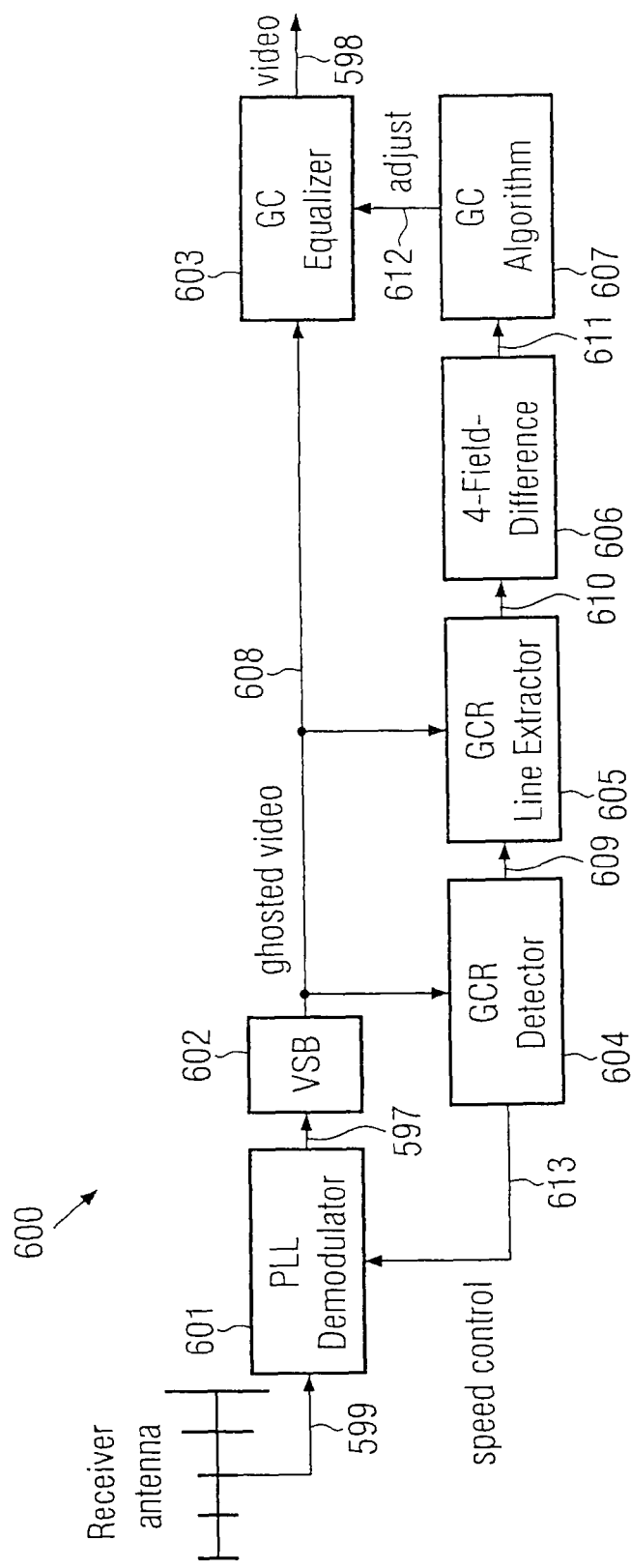
FIG. 5 shows a demodulating circuit for demodeling an analogue television signal.

FIG. 5 shows a further circuit 600 according to a further embodiment of the invention. Circuit 600 may be used e.g. for demodulating an analogue television signal 599 and output a ghost-free video signal 598.

Circuit 600 comprises a PLL demodulator 601, vestigial sideband filter 602, ghost canceling (GC) equalizer 603, ghost canceling reference signal (GCR) detector 604, GCR line extractor 605, four-field-difference calculator 606, and data processor 607.

The input signal 599 may have been received by e.g. an antenna or via cable. Input signal 599 may comprise complex distortions, e.g. resulting from echoes. PLL demodulator 601 tries to follow the phase and/or frequency of input signal 599. The output of PLL demodulator is a demodulated signal 597 that is further processed by the vestigial sideband filter 602 and GC equalizer 603.

The filter coefficients 612 of GC equalizer 603 are determined based on signal 608 and GCR detector 604, GCR line extractor 605 and four-field difference calculator 606.

If GCR detector 604 detects a ghost canceling reference signal, GCR detector 604 may control the speed of PLL demodulator 601 via speed control signal 613. Thus, the influence of PLL demodulator 601 on vestigial sideband filter 602 and/or GC equalizer 603 as well as on the determination of filter coefficients 612 may be controlled by GCR detector 604. If GCR detector 604 detects a reference signal, then the speed may be set to a lower level. Thus, e.g. for the duration of a reference signal, the speed of the PLL demodulator 601 may be decreased in comparison to when no reference signal is received. It may also be possible that the speed of the PLL demodulator 601 is decreased a certain period of time before a reference signal is expected until a certain period of time after the reference signal. By such control of the speed of PLL demodulator 601, it may be possible to make sure that the PLL speed is at a low level when a reference signal is received. Also, if the ghost canceling reference signal is distorted by echoes, then in order to capture such echoes, it may be good to lower the speed of the PLL demodulator 601 before a reference signal occurs until after an occurrence of a reference signal.

It should be noted that this is possible, because in analogue television, ghost canceling reference signals occur in predetermined lines e.g. in the $18^{th}$ and $281^{st}$ line in a repeated manner. In other words, two different reference signals GCR_A and GCR_B may be transmitted in line 18 and 281, respectively, of a television signal. However, for the reasons mentioned above, the ghost canceling reference detector 604 may decrease the speed of PLL demodulator 601 already half a line before the $18^{th}$ and $281^{st}$ line, respectively, and may maintain the lower speed until half a line after the $18^{th}$ and $281^{st}$ line, respectively.

Four-field difference calculator 606 subtracts GCR_A from GCR_B according to the four-field difference operation. The difference signal GCR_F' is then compared with GCR_F which is completely known by the receiver and can therefore be used in data processor 607 to determine filter coefficients to equalize signal 608 in order to output a ghost-free video signal 598.

It should be noted that the reference signal GCR_F only allows for a good equalization under static or very slowly time-varying channel conditions. However, in case of complex valued echoes, the phase/frequency estimation of the PLL demodulator 601 may be influenced by the wave form of the received signal. By controlling the speed of the PLL, such influences may be reduced. Therefore, the PLL video carrier phase/frequency correction may behave the same for GCR_A and GCR_B signals. Thus, the difference signal GCR_F' may be improved in that there are no influences of PLL demodulator 601. Therefore, a data processor 607 may only see signal distortions originating from the transmission channel and not distortions caused by the PLL. Therefore, data processor 607 may be able to determine filter coefficients 612 that are better suited to equalize the video signal. Finally, this may lead to a better equalization of the output signal 598.

Figure 6:
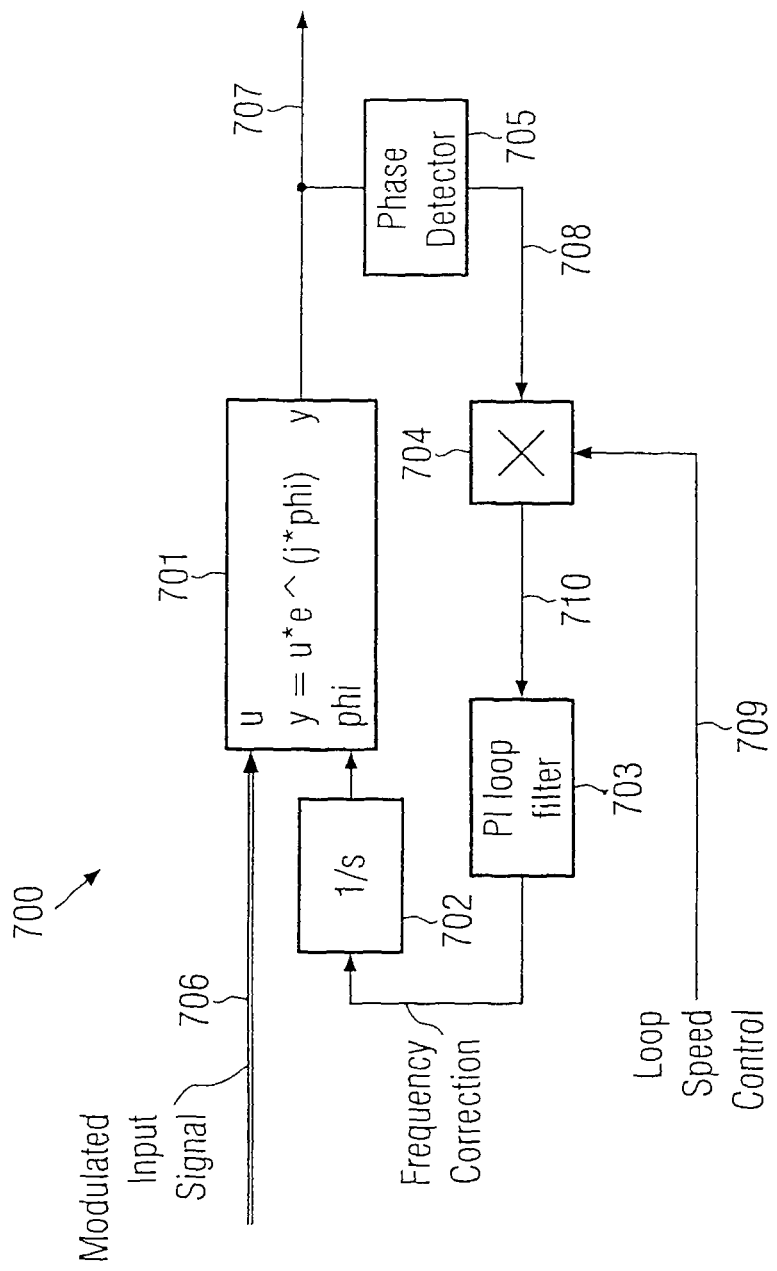
FIG. 6 shows a phase locked loop according to an embodiment of the invention.

FIG. 6 shows a possible embodiment of a PLL circuit 700 with speed control. PLL circuit 700 comprises a phase shifter 701, integrator 702, loop filter 703, multiplier 704 and phase detector 705. The input signal 706 may be a modulated input signal and the output signal 707 may be a demodulated signal. Based on output signal 707 phase detector 705 determines a phase error signal 708. Phase error signal 708 is multiplied with a speed control signal 709 by multiplier 704.

By multiplying phase error signal 708 with speed control signal 709, signal 710 may be increased or decreased in comparison to phase error signal 708. Thus, by setting the multiplication factor, i.e. the magnitude of the speed control signal 709, it is possible to control the speed according to which PLL circuit 700 follows the frequency and/or phase of modulated input signal 706.

It should be noted that input signal 706 may correspond to a complex base band signal, e.g. a down converted video signal.

It should also be noted that multiplier 704 allows for a continuous loop speed control without switching artifacts. For example, speed control signal 709 may be increased or decreased continuously such that no switching artifacts may occur.

Figure 7:
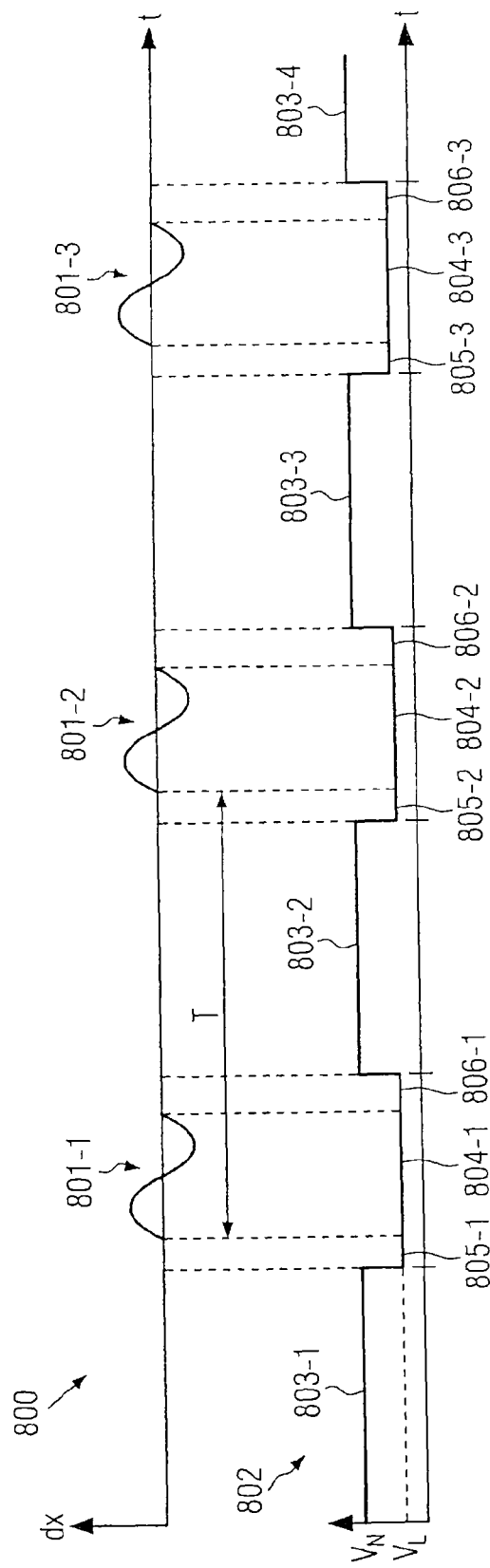
FIG. 7 shows diagrams with reference signals and corresponding speed of a PLL demodulator.

FIG. 7 shows a first diagram 800 depicting an example of a sequence of reference signals 801. In the diagram 800, as an example, reference signals 801 may occur with a certain repeating rate (period) T.

Diagram 802 of FIG. 7 shows how the speed of a PLL circuit may be controlled. Diagram 802 shows periods 803 where the speed of the PLL is controlled at a normal level $v_N$. During periods 803, no reference signal 801 occurs. As seen, a certain period of time 805 before the occurrence of a reference signal 801, the PLL speed is decreased to a lower level $v_L$. The lower level $v_L$ is maintained during a period 806 following the duration of reference signal 801 corresponding to period 804 in diagram 802. Because the speed is already lowered a period of time 805 before the occurrence of a reference signal 801 and maintained until a certain period 806 after the occurrence of a reference signal 801, it may be possible to eliminate any distortions resulting from echoes of the reference signal itself.

Figure 8:
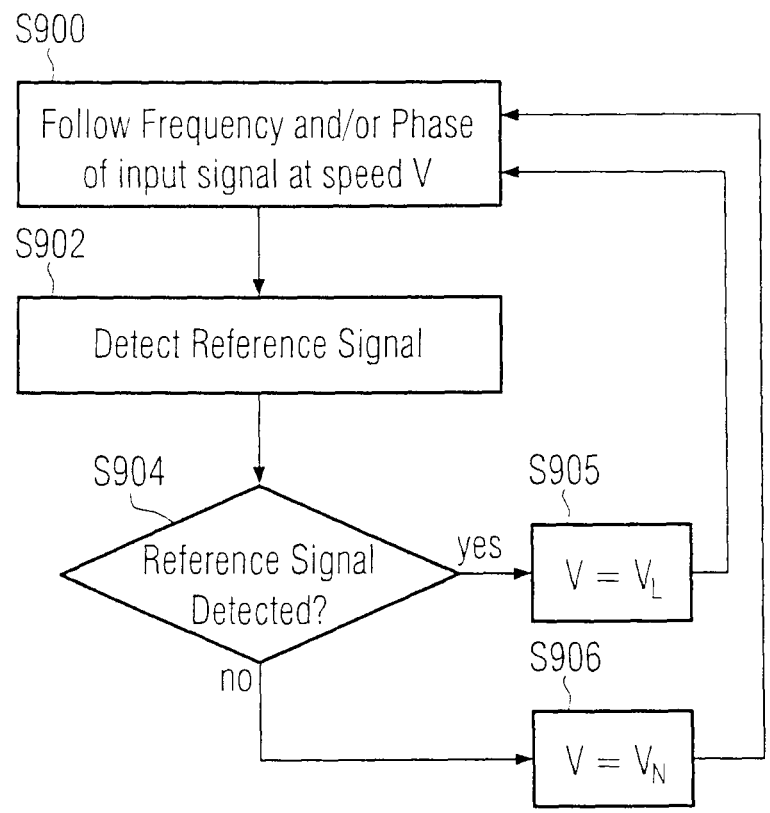
FIG. 8 shows steps of a method according to an embodiment of the invention.

FIG. 8 shows a diagram according to an embodiment of a method for processing an input signal. In step 900, a phase locked loop is used for following a frequency and/or phase of an input signal at speed V.

In step S902, a reference signal is detected. In step S904, it is determined if a reference signal has been detected. If a reference signal has been detected, in step S905, speed V of the phase locked loop is set to a low level $V_L$. If in step S904, no reference signal is detected, then in step S906, the speed V of the phase locked loop is set to $V^N$, i.e. to a normal speed.

It should be noted that as explained in connection with FIG. 7, it is possible that the speed is decreased to a predetermined level (low level) for a period of time starting before an occurrence of the reference signal and lasting until after the occurrence of a reference signal.

In a further embodiment of the invention, a circuit for ghost cancelling of a television signal, may comprise a ghost cancelling reference signal detector configured to detect a ghost cancelling reference signal; a PLL demodulator configured to follow a video carrier frequency and/or phase of said television signal at a speed, wherein said speed is controlled depending on said ghost cancelling reference signal.

In a further embodiment of the invention, a circuit for equalizing an input signal based on a reference signal, may comprise a phase locked loop demodulator configured to receive a speed control signal and said input signal and further configured to follow a frequency and/or a phase of said input signal, wherein said phase locked loop demodulator includes a speed control mechanism configured to control a following speed of said phase locked loop demodulator, wherein said following speed depends on said speed control signal, and wherein said following speed determines at what speed said phase locked loop demodulator follows said frequency and/or said phase; and a reference signal detector configured to determine said reference signal and to output said speed control signal to said phase locked loop demodulator, wherein, if said reference signal is detected, said speed control signal indicates a lower speed than if no reference signal is detected.

In a further embodiment of the invention, a television set configured to receive a television signal, may comprise a ghost cancelling reference signal detector configured to detect a ghost cancelling reference signal; a PLL demodulator configured to follow a video carrier frequency and/or phase of said television signal at a speed, wherein said speed is controlled depending on said ghost cancelling reference signal; and a ghost cancelling equalizer configured to cancel ghosts of said television signal based on said ghost cancelling reference signal.

In a further embodiment of the invention, a circuit for equalizing an input signal based on at least one reference signal, may comprise a phase locked loop demodulator configured to receive a speed control signal and said input signal and further configured to follow a frequency and/or a phase of said input signal at a speed, wherein said speed depends on said speed control signal; a reference signal detector configured to determine said at least one reference signal and to set said speed by outputting said speed control signal to said phase locked loop demodulator, wherein, if said reference signal detector detects said at least one reference signal, said reference signal detector sets said speed to a lower speed than if said reference signal detector does not detect said at least one reference signal.

The invention claimed is:
1. Circuit for processing an input signal based on at least one reference signal, comprising:
  a phase locked loop demodulator configured to demodulate the input signal to obtain, from the input signal, a demodulated signal, the phase locked loop demodulator comprising a phase detector for determining a phase error signal from the demodulated signal, and the phase locked loop demodulator further configured to follow, using the phase error signal, a frequency and/or a phase of said input signal; and a reference signal detector configured to detect said at least one reference signal and to output a speed control signal to said phase locked loop demodulator when the at least one reference signal is detected, wherein, said phase locked loop demodulator controls, based on the speed control signal, a speed of the phase locked loop demodulator, where the speed defines how quickly the phase locked loop demodulator matches the frequency and/or phase of the input signal, and said reference signal detector is further configured to set said speed to zero a first predetermined period of time before an occurrence of said at least one reference signal and to maintain zero speed until a second predetermined period of time after said occurrence of said at least one reference signal.

2. Circuit according to claim 1, wherein said reference signal detector decreases said speed to a predetermined level, said predetermined level being lower than a normal level before said at least one reference signal was detected.

3. Circuit according to claim 1 or 2, wherein said speed is decreased for a predetermined period of time.

4. Circuit according to claim 1 or 2, wherein said speed is decreased for a period of time which depends on the duration of said at least one reference signal.

5. Circuit according to claim 4, wherein said period of time starts before an occurrence of said at least one reference signal and lasts until after said occurrence of said at least one reference signal.

6. Circuit according to claim 1, wherein said at least one reference signal occurs periodically and has a predetermined duration.

7. Circuit according to claim 1, wherein said phase locked loop demodulator comprises a speed control mechanism configured to control said speed.

8. Circuit according to claim 7, wherein said speed control mechanism is a multiplier arranged in a feedback path of said phase locked loop demodulator.

9. Circuit according to claim 8, wherein said multiplier is configured to multiply a phase error with said speed control signal or a derivative thereof.

10. Circuit according to claim 1, wherein said speed control signal indicates zero speed, if said reference signal detector detects said at least one reference signal.

11. Circuit according to claim 1, further comprising
an equalizer configured to equalize said input signal;
a data processor configured to determine filter coefficients for said equalizer based on said at least one reference signal.

12. Circuit according to claim 1, wherein said input signal is an analogue television signal.

13. Circuit according to claim 12, wherein said at least one reference signal is a ghost canceling reference signal of said analogue television signal, and wherein said reference signal detector is a ghost canceling reference signal detector configured to detect said ghost cancelling reference signal in said analogue television signal.

14. Circuit according to claim 12, wherein said reference signal detector includes a line detector configured to determine lines of said analogue television signal.

15. Circuit according to claim 12, wherein said at least one reference signal is a ghost canceling reference signal for canceling ghosts of said television signal.

16. Receiver comprising a circuit according to claim 1.

17. Method for processing an input signal based on at least one reference signal, comprising:
demodulating the input signal to obtain from the input signal a demodulated signal using a phase locked loop demodulator, the phase locked loop demodulator comprising a phase detector for determining a phase error signal from the demodulated signal;
following, by the phase locked loop demodulator using the phase error signal, a frequency and/or a phase of said input signal;
detecting said at least one reference signal;
when the at least one reference signal is detected, outputting a speed control signal to the phase locked loop demodulator;
controlling, by the phase locked loop demodulator and based on the speed control signal, a speed of the phase locked loop demodulator, where the speed defines how quickly the phase locked loop demodulator matches the frequency and/or phase of the input signal;
setting said speed to zero a first predetermined period of time before an occurrence of said at least one reference signal; and
maintaining zero speed until a second predetermined period of time after said occurrence of said at least one reference signal.

18. Method according to claim 17, wherein said speed is decreased to a predetermined level, said predetermined level being lower than a normal level before said at least one reference signal was detected.

19. Method according to claim 17, wherein said speed is decreased for a predetermined period of time.

20. Method according to claim 17, wherein said speed is decreased for a period of time which depends on the duration of said at least one reference signal.

21. Method according to claim 20, wherein said period of time starts before an occurrence of said at least one reference signal and lasts until after said occurrence of said at least one reference signal.

22. Method according to claim 17, wherein said at least one reference signal occurs periodically and has a predetermined duration.

23. Method according to claim 17, wherein said speed is controlled by multiplying a phase error in the feedback path of said phase locked loop with a speed control factor.

24. Method according to claim 17, wherein said speed is set to zero, if a reference signal is detected.

25. Method according to claim 17, comprising equalizing said input signal based on filter coefficients, wherein said filter coefficients are determined based on said at least one reference signal.

26. Method according to claim 17, wherein said input signal is an analogue television signal.

27. Method according to claim 26, wherein said at least one reference signal is a ghost canceling reference signal of said analogue television signal.

28. A non-transitory computer readable medium including computer program instructions that cause a computer to execute a method for processing an input signal based on at least one reference signal, comprising:
demodulating the input signal to obtain from the input signal a demodulated signal using a phase locked loop demodulator, the phase locked loop demodulator comprising a phase detector for determining a phase error signal from the demodulated signal;
following, by the phase locked loop demodulator using the phase error signal, a frequency and/or a phase of said input signal;
detecting said at least one reference signal;
when the at least one reference signal is detected, outputting a speed control signal to the phase locked loop demodulator;

controlling, by the phase locked loop demodulator and based on the speed control signal, a speed of the phase locked loop demodulator, where the speed defines how quickly the phase locked loop demodulator matches the frequency and/or phase of the input signal;

setting said speed to zero a first predetermined period of time before an occurrence of said at least one reference signal; and maintaining zero speed until a second predetermined period of time after said occurrence of said at least one reference signal.

29. Circuit for ghost cancelling of a television signal, comprising:

a ghost cancelling reference signal detector configured to detect a ghost cancelling reference signal; and a phase locked loop (PLL) demodulator configured to demodulate the television signal to obtain from the television signal a demodulated signal, wherein, using the phase error signal, the PLL demodulator follows a video carrier frequency and/or phase of said television signal, wherein said PLL demodulator controls, based on the ghost cancelling reference signal, a speed of the phase locked loop demodulator, where the speed defines how quickly the phase locked loop demodulator matches the frequency and/or phase of the television signal, and said ghost cancelling reference signal detector is further configured to set said speed to zero a first predetermined period of time before an occurrence of said ghost cancelling reference signal and to maintain zero speed until a second predetermined period of time after said occurrence of said ghost cancelling reference signal.

30. Circuit for equalizing an input signal based on a reference signal, comprising:

a phase locked loop demodulator configured to demodulate the input signal to obtain, from the input signal, a demodulated signal, the phase locked loop demodulator comprising a phase detector for determining a phase error signal from the demodulated signal, and the phase locked loop demodulator further configured to follow, using the phase error signal, a frequency and/or a phase of said input signal; and a reference signal detector configured to detect said reference signal and to output a speed control signal to said phase locked loop demodulator when the reference signal is detected, wherein said phase locked loop demodulator includes a speed control mechanism configured to control a following speed of said phase locked loop demodulator based on the speed control signal, where the following speed defines how quickly the phase locked loop demodulator matches the frequency and/or phase of the input signal, and said reference signal detector is further configured to set said following speed to zero a first predetermined period of time before an occurrence of said reference signal and to maintain zero speed until a second predetermined period of time after said occurrence of said reference signal.

31. Television set configured to receive a television signal, the television set comprising:

a ghost cancelling reference signal detector configured to detect a ghost cancelling reference signal;

a phase locked loop (PLL) demodulator configured to demodulate the television signal to obtain, from the television signal, a demodulated signal, the PLL demodulator comprising a phase detector for determining a phase error signal from the demodulated signal, and the PLL demodulator further configured to follow, using the phase error signal, a video carrier frequency and/or phase of said television signal; and a ghost cancelling equalizer configured to cancel ghosts of said television signal based on said ghost cancelling reference signal, wherein said PLL demodulator controls, based on the ghost cancelling reference signal, a speed of the phase locked loop demodulator, where the speed defines how quickly the phase locked loop demodulator matches the frequency and/or phase of the television signal, and said ghost cancelling reference signal detector is further configured to set said speed to zero a first predetermined period of time before an occurrence of said ghost cancelling reference signal and to maintain zero speed until a second predetermined period of time after said occurrence of said ghost cancelling reference signal.

32. Circuit for equalizing an input signal based on at least one reference signal, comprising:

a phase locked loop demodulator configured to demodulate the input signal to obtain, from the input signal, a demodulated signal, the phase locked loop demodulator comprising a phase detector for determining a phase error signal from the demodulated signal, and the phase locked loop demodulator further configured to follow, using the phase error signal, a frequency and/or a phase of said input signal; and a reference signal detector configured to detect said at least one reference signal and to output a speed control signal to said phase locked loop demodulator when the at least one reference signal is detected, wherein said phase locked loop demodulator controls, based on the speed control signal, a speed of the phase locked loop demodulator, where the speed defines how quickly the phase locked loop demodulator matches the frequency and/or phase of the input signal, and said reference signal detector is further configured to set said speed to zero a first predetermined period of time before an occurrence of said at least one reference signal and to maintain zero speed until a second predetermined period of time after said occurrence of said at least one reference signal.

* * * * *